(12) United States Patent
Fujikawa et al.

(10) Patent No.: US 7,034,335 B2
(45) Date of Patent: *Apr. 25, 2006

(54) ITO FILM CONTACT STRUCTURE, TFT SUBSTRATE AND MANUFACTURE THEREOF

(75) Inventors: Tetsuya Fujikawa, Kawasaki (JP); Hidetoshi Sukenori, Kawasaki (JP); Shougo Hayashi, Kawasaki (JP); Yoshinori Tanaka, Kawasaki (JP); Masahiro Kihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/999,405

(22) Filed: Nov. 30, 2004

(65) Prior Publication Data

US 2005/0092999 A1 May 5, 2005

Related U.S. Application Data

(62) Division of application No. 10/292,179, filed on Nov. 12, 2002, now Pat. No. 6,897,479, which is a division of application No. 09/925,666, filed on Aug. 9, 2001, now Pat. No. 6,509,215, which is a division of application No. 09/298,775, filed on Apr. 22, 1999, now Pat. No. 6,297,519.

(30) Foreign Application Priority Data

Aug. 28, 1998 (JP) .................................. 10-243449
Jan. 29, 1999 (JP) .................................. 11-22501

(51) Int. Cl.
*H01L 29/04* (2006.01)

(52) U.S. Cl. .......................... 257/59; 257/72; 257/774; 257/776

(58) Field of Classification Search .................. 257/59, 257/72, 347, 774, 776; 438/30, 157, 158, 438/149; 349/43, 139
See application file for complete search history.

(56) References Cited

U.S. PATENT DOCUMENTS 5,917,221 A * 6/1999 Takemura .................... 257/365

(Continued)

FOREIGN PATENT DOCUMENTS

JP           5-243333         9/1993

(Continued)

*Primary Examiner*—Minh-Loan Tran
(74) *Attorney, Agent, or Firm*—Greer, Burns & Crain, Ltd.

(57) ABSTRACT

A conductive film made of Al or alloy containing Al as a main component is formed on an underlying substrate. An upper conductive film is disposed on the conductive film. A first opening is formed through the upper conductive film. An insulating film is disposed on the upper conductive film. A second opening is formed through the insulating film. An inner wall of the second opening is retreated from an inner wall of the first opening. An ITO film is formed covering a partial upper surface of the insulating film and inner surfaces of the first and second openings, and contacting a partial upper surface of the upper conductive film at a region inside of the second opening. Good electrical contact between an Al or Al alloy film and an ITO film can be established and productivity can be improved.

5 Claims, 9 Drawing Sheets

U.S. PATENT DOCUMENTS

| | | |
|---|---|---|
| 5,998,230 A | 12/1999 | Gee-Sung et al. |
| 6,008,065 A | 12/1999 | Lee et al. |
| 6,087,678 A | 7/2000 | Kim |
| 6,190,934 B1 | 2/2001 | Kang et al. |
| 6,288,414 B1 | 9/2001 | Ahn |
| 6,297,519 B1 | 10/2001 | Fujikawa et al. |

FOREIGN PATENT DOCUMENTS

| | | |
|---|---|---|
| JP | 10209462 | 8/1998 |
| KR | 1998-072407 | 11/1998 |

\* cited by examiner

ITO FILM CONTACT STRUCTURE, TFT SUBSTRATE AND MANUFACTURE THEREOF

This is a Divisional of parent application Ser. No. 10/292,179, now U.S. Pat. No. 6,897,479, filed Nov. 12, 2002, now U.S. Pat. No. 6,879,479 which is a Divisional of application Ser. No. 09/925,666, now U.S. Pat. No. 6,509,215, filed on Aug. 9, 2001, which is a Divisional of application Ser. No. 09/298,775, filed Apr. 22, 1999, now U.S. Pat. No. 6,297,519.

This application is based on Japanese patent applications HEI 10-243449 filed on Aug. 28, 1998 and HEI 11-22501 filed on Jan. 29, 1999, the whole contents of which are incorporated herein by reference.

BACKGROUND OF THE INVENTION a) Field of the Invention

The present invention relates to an indium tin oxide (ITO) film contact structure, a thin film transistor (TFT) substrate, and its manufacture, and more particularly to a structure for electrically contacting an ITO film with an Al alloy film, a TFT substrate having such a contact structure, a method of manufacturing such a TFT substrate, and a TFT substrate with external connection terminals.

b) Description of the Related Art

FIG. 8 is a cross sectional view of a TFT and a pixel electrode of a conventional active matrix type liquid crystal display panel. TFT's are disposed in a matrix pattern on an image display area of a glass substrate 1, and external terminals 3 are disposed in a border area around the image display area. FIG. 8 shows a single TFT 10 among a plurality of TFT's.

TFT 10 is constituted of a gate electrode 11, a channel layer 12, a channel protective film 18, a source electrode 13S, and a drain electrode 13D. The gate electrode 11 is disposed on the surface of the glass substrate 1. A first insulating film 4 is formed on the glass substrate 1, covering the gate electrode 11, and the channel layer 12 is formed on the first insulating film 4, overriding the gate electrode 11. The channel protective film 18 protects a surface of the channel layer 12 over the gate electrode 11.

Partial surfaces of the channel layer 12 on both sides of the gate electrode 11 are covered with the source electrode 13S and drain electrode 13D. Each of the source electrode 13S and drain electrode 13D has a four-layer structure having an amorphous silicon film 14, a lower Ti film 15, an Al film 16, and an upper Ti film 17 laminated in this order from the bottom.

A second insulating film 30 is formed on the first insulating film 4, and covers TFT 10. An opening 31 is formed through the second insulating film 30 in an area corresponding to the source electrode 13S. An indium tin oxide (ITO) film 35 is formed on the inner surface of the opening 31 and on a partial surface of the second insulating film 30. The ITO film 35 is connected to the source electrode 13S at the bottom of the opening 31.

In the border area, the external terminal 3 is covered with the first and second insulating films 4 and 30. An opening 40 is formed through these two first and second insulating films 4 and 30, the opening 40 exposing a partial top surface of the external terminal 3.

The lower Ti film 15 inserted between the Al film 16 and amorphous silicon layer 14 prevents the element performance from being degraded by Al diffusion. If the Al film 16 is directly contacted with the ITO film 35, a contact resistance is high. The upper Ti film 17 inserted between the Al film 16 and ITO film 35 lowers the contact resistance.

In the conventional active matrix type liquid crystal display panel shown in FIG. 8; the openings 31 and 40 are formed at the same time. The depth of the opening 31 corresponds to the thickness of the second insulating film 30, whereas the depth of the opening 40 corresponds to a total thickness of the first and second insulating films 4 and 30. Therefore, while the first insulating film 4 is etched to form the opening 40, the upper Ti film 17 on the bottom of the opening 31 is exposed to the etching atmosphere. If the upper Ti film 17 on the bottom of the opening 31 is completely removed, the ITO film 35 directly contacts the Al film so that the contact resistance becomes high.

In order to leave the upper Ti film 17 on the bottom of the opening 31 with good reproductivity, it is necessary to make the upper Ti film 17 sufficiently thick. For example, it is preferable to make the upper Ti film 17 have a thickness of 100 nm or more. As the upper Ti film 17 is made thick, it takes a longer time to etch and pattern the source and drain electrodes 13S and 13D, so that improvement on productivity is hindered.

FIG. 9 is a cross sectional view of a terminal formed on the surface of a conventional TFT substrate. A gate insulating film 4 covers the surface of a glass substrate 1. An amorphous silicon film 12a is formed on a partial surface area of the gate insulating film 4. A terminal 21a is formed on the amorphous silicon film 12a. The terminal 21a has a lamination structure of an amorphous silicon film 14a, a lower Ti film 15a, an Al film 16a, and an upper Ti film 17a, sequentially laminated in this order. In the pixel area, the amorphous silicon film 12a constitutes a channel layer of a TFT, and the four layers from the amorphous silicon film 14a to the upper Ti film 17a constitute a source electrode, a drain electrode, and a drain bus line, respectively of TFT.

A second insulating film (protective insulating film) 30 is formed on the first insulating film (gate insulating film) 4, covering the Lamination structure from the amorphous silicon film 12a to the upper Ti film 17a. A contact hole 32 is formed through the protective insulating film 30, in an area above the terminal 21a. A terminal protective conductive film 35a made of indium tin oxide (ITO) covers the inner surface of the contact hole 32 and the nearby surface of the protective insulating film 30. The terminal protective conductive film 35a prevents corrosion and damages of the terminal 21a. The terminal protective conductive film 35a is formed at the same time when a pixel electrode is formed in the pixel area.

A probe is made in contact with the surface of the terminal protective conductive film 35a to conduct a conduction test and an insulation test. A terminal for a tape automatic bonding (TAB) terminal has a similar structure to that shown in FIG. 9.

In the past, there was a case that when a probe was made in contact with the surface of the terminal protective conductive film 35a shown in FIG. 9, the probe broke through the terminal protective conductive film 35a and gave damages to the underlying upper Ti film 17a and Al film 16a.

SUMMARY OF THE INVENTION

It is an object of the present invention to provide an ITO film contact structure capable of realizing good electrical contact between Al or Al alloy film and an ITO film, and improving productivity.

It is another object of the present invention to provide a TFT substrate and its manufacture method capable of realizing good electrical contact between Al or Al alloy film and an ITO film, and improving productivity.

It is another object of the present invention to provide a TFT substrate having a high connection reliability terminal structure hard to be damaged when a probe is made in contact with this structure.

According to one aspect of the present invention, there is provided an ITO film contact structure comprising: a conductive film made of Al or alloy containing Al as a main component; an upper conductive film disposed on said conductive film, formed with a first opening, and made of a material different from Al; an insulating film disposed on said upper conductive film and formed with a second opening, an inner wall of the second opening being retreated from an inner wall of the first opening; and an ITO film covering a partial upper surface of said insulating film and inner surfaces of the first and second openings, and contacting a partial upper surface of said upper conductive film at a region defining a part of the inner wall of the second opening.

Since the ITO film is connected via the upper conductive film to the conductive film, good electrical contact between the ITO film and conductive film can be established.

DETAILED DESCRIPTION OF THE PREFERRED EMBODIMENTS

Figure 1:
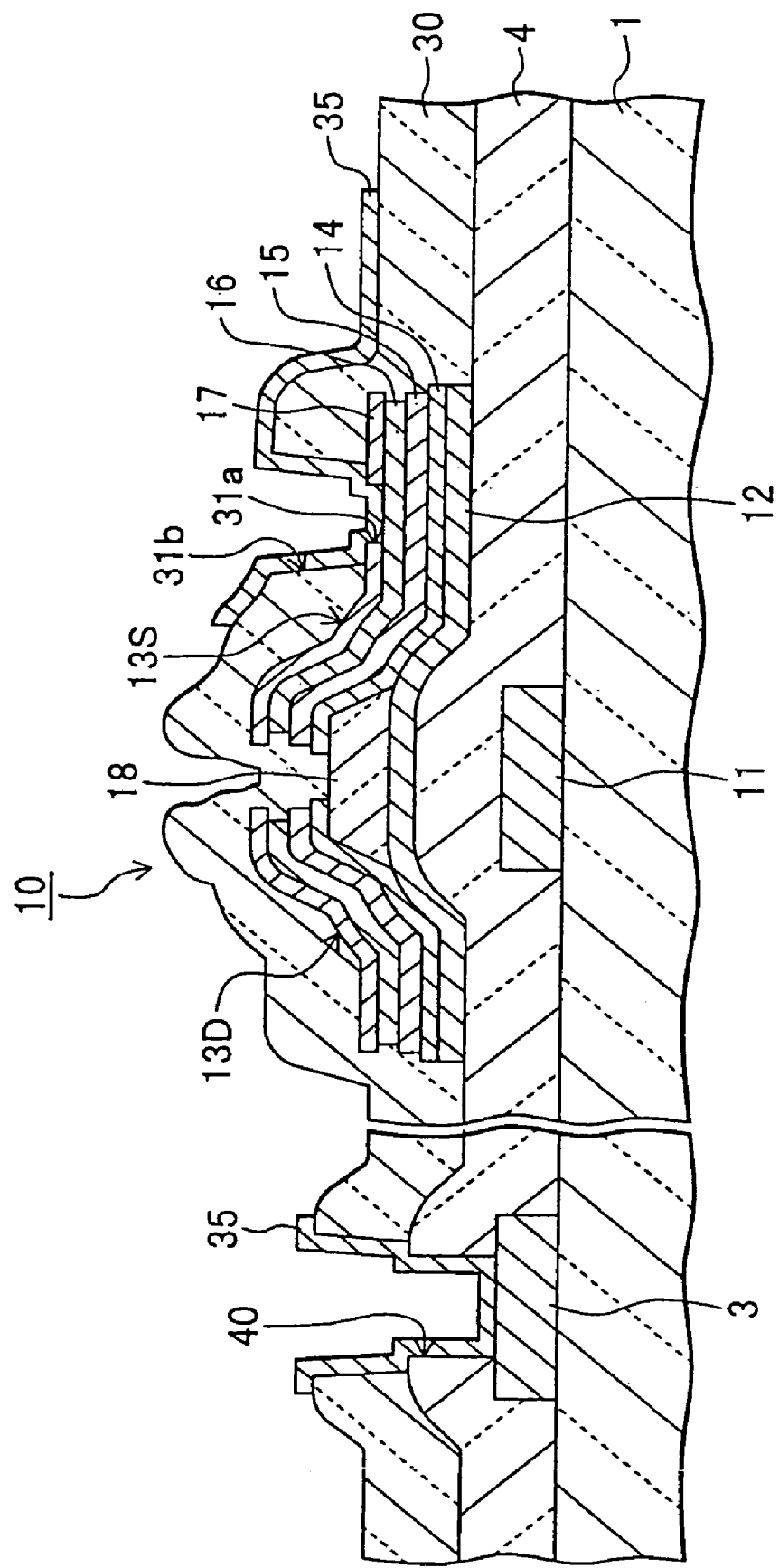
FIG. 1 is a cross sectional view of a TFT substrate according to a first embodiment of the invention.

FIG. 1 is a cross sectional view of a TFT substrate according to an embodiment of the invention. TFT's 10 are disposed in a matrix pattern on an image display area of a glass substrate 1, and external terminals 3 are disposed in a border area around the image display area. FIG. 1 shows a single TFT 10 among a plurality of TFT's.

TFT 10 is constituted of a gate electrode 11, a channel layer 12, a channel protective film 18, a source electrode 13S, and a drain electrode 13D. The gate electrode 11 made of Cr (or Al alloy, Al/Ti lamination or the like) and having a thickness of 150 nm is disposed on the surface of the glass substrate 1. Each gate electrode 11 is continuous with a control line extending in a row direction (not shown in FIG. 1). The control line extends to the border area and is continuous with the external terminal 3.

A first insulating film 4 made of SiN and having a thickness of 400 nm is formed on the glass substrate 1, the film 4 covering the gate electrode 11. The channel layer 12 made of amorphous silicon and having a thickness of 30 nm is formed on the first insulating film 4, the channel layer 12 overriding the gate electrode 11.

The channel protective film 18 protects a partial surface of the channel layer 12 over the gate electrode 11. The channel protective film 18 is made of SiN and has a thickness of 120 nm.

Surface areas of the channel layer 12 on both sides of the gate electrode 11 are covered with the source electrode 13S and drain electrode 13D. Each of the source electrode 13S and drain electrode 13D has a four-layer structure having an n$^+$-type amorphous silicon film 14, a lower Ti film 15, an Al film 16, and an upper Ti film 17 laminated in this order from the bottom. The n$^+$-type amorphous silicon film 14 is 30 nm in thickness, the lower and upper Ti films 15 and 17 are 20 nm in thickness, and the Al film 16 is 100 nm in thickness. An opening 31a is formed through the upper Ti film 17 of the source electrode 13S.

A second insulating film 30 made of SiN and having a thickness of 300 nm is formed on the first insulating film 4, the film 30 covering TFT 10. An opening 31b is formed through the second insulating film 30 in an area corresponding to the opening 31a. When looking along a direction normal to the substrate, the circumference of the opening 31b is located outside the circumference of the opening 31a. An ITO film 35 having a thickness of 70 nm is formed on the inner surfaces of the openings 31a and 31b and on a partial surface of the second insulating film 30.

In the border area, the external terminal 3 is covered with the first and second insulating films 4 and 30. An opening 40 is formed through these two first and second insulating films 4 and 30, the opening 40 exposing a partial top surface of the external terminal 3. The inner wall of the opening 40 in the second insulating film 30 is retreated from the inner wall of the opening in the first insulating film 4. Namely, a step is formed at the position corresponding to the interface between the first and second insulating films 4 and 30.

In the embodiment shown in FIG. 1, the ITO film 35 contacts the upper surface of the upper Ti film 17 in an area inside the opening 31b, and also contacts the Al film 16 at the bottom of the opening 31a. Therefore, even if the contact resistance of a contact area where the ITO film 35 contacts to the Al film 16 directly is high, good electrical contact between the ITO film 35 and source electrode 13S can be established because the ITO film 35 also connects the Al film 16 via the upper Ti film 17.

Next, a manufacture method of the TFT substrate shown in FIG. 1 will be described. A Cr film is formed on the surface of the glass substrate 1. This Cr film is patterned to leave the gate electrode 11 and external terminal 3. At this time, the control line extending in the row direction is also left. The first insulating film 4 made of SiN is deposited to a thickness of 400 nm on the surface of the glass substrate 1. The first insulating film 4 is deposited through chemical vapor deposition (CVD) using SiH$_4$ and NH$_3$ as source gases at, a substrate temperature of 320° C.

An amorphous silicon film is deposited on the surface of the first insulating film 4 to a thickness of 30 nm. The amorphous silicon film is used as the channel layer 12. The amorphous silicon film is deposited through CVD using SiH$_4$ and H$_2$ as source gas at a substrate temperature of 310° C.

A SiN film is deposited on the surface of the amorphous silicon film to a thickness of 120 nm, and patterned to leave the channel protective film 18. The SiN film used for the channel protective film 18 is deposited through CVD using $SiH_4$ and $NH_3$ as source gases at a substrate temperature of 320° C.

An $n^+$-type-amorphous silicon film of 30 nm in thickness, a Ti film of 20 nm in thickness, an Al film of 100 nm in thickness, and a Ti film of 20 nm in thickness are sequentially deposited over the whole surface of the substrate. The amorphous silicon film is deposited through CVD using $SiH_4$ and $PH_3$ as source gases at a substrate temperature of 250° C. The Ti and Al films are deposited through sputtering at a room temperature.

A resist pattern for forming the source and drain electrodes 13S and 13D is formed on the surface of the uppermost Ti film. By using this resist pattern as a mask, the lamination structure is etched down to the amorphous silicon film on the first insulating film 4. This etching is performed by reactive ion etching (RIE) using a mixture gas of $Cl_2$ and $BCl_3$. For example, the flow rates of $Cl_2$ and $BCl_3$ are both 100 sccm. It took about 120 seconds to etch the lamination structure down to the amorphous Si film.

The channel protective film 18 functions as an etching stopper layer in a region above the gate electrode 11, so that the etching stops substantially at the upper surface of the channel protective film 18. With this etching process, the channel layer 12, source electrode 13S, and drain electrode 13D are formed.

The second insulating film 30 of SiN is deposited over the whole surface of the substrate to a thickness of 300 nm. The second insulating film 30 is deposited through CVD using $SiH_4$ and $NH_3$ as source gases at a substrate temperature of 230° C. which is lower than that when the first insulating film 4 is deposited.

The opening 31b is formed through the second insulating film 30, and at the same time the opening 40 is formed through the first and second insulating films 4 and 30. These openings 31b and 40 are formed through RIE using a mixture gas of $SF_6$ and $O_2$ under the etching conditions of $SF_6$ flow rate of 200 sccm, $O_2$ flow rate of 200 sccm, and a pressure of 10 Pa. Under these etching conditions, the second insulating film is side-etched. The upper Ti film 17 is etched generally in a direction normal to the substrate surface, because of a large impact force of ions collided with the upper Ti film 17. The inner wall of the opening 31b in the second insulating film 30 is therefore retreated from the inner wall of the opening 31a in the upper Ti film 17.

The first insulating film 4 is deposited at a growth temperature higher than that when the second insulating film is deposited. Therefore, the etching rate of the first insulating film 4 is slower than that of the second insulating film 30. A difference between the etching rates forms the step on the inner wall of the opening 40. Thereafter, an ITO film is deposited over the whole surface of the substrate and patterned to leave the ITO film 35.

With this manufacture method, good electrical contact between the ITO film 35 and source electrode 13S can be established even if the Al film 16 is exposed at the bottom of the opening 31b. It is therefore unnecessary to make the upper Ti film thick. In the conventional TFT substrate shown in FIG. 4, in order to leave the upper Ti film 17 at the bottom of the opening 31, the thickness thereof was set to about 100 nm. If the upper Ti film 17 having a thickness of about 100 nm is used, it takes about 165 seconds to pattern the lamination structure from the upper Ti film 17 to the channel layer 12. In contrast, in this embodiment, it is possible to pattern the lamination structure from the upper Ti film 17 to the channel layer 12 in about 120 seconds.

Figure 2:
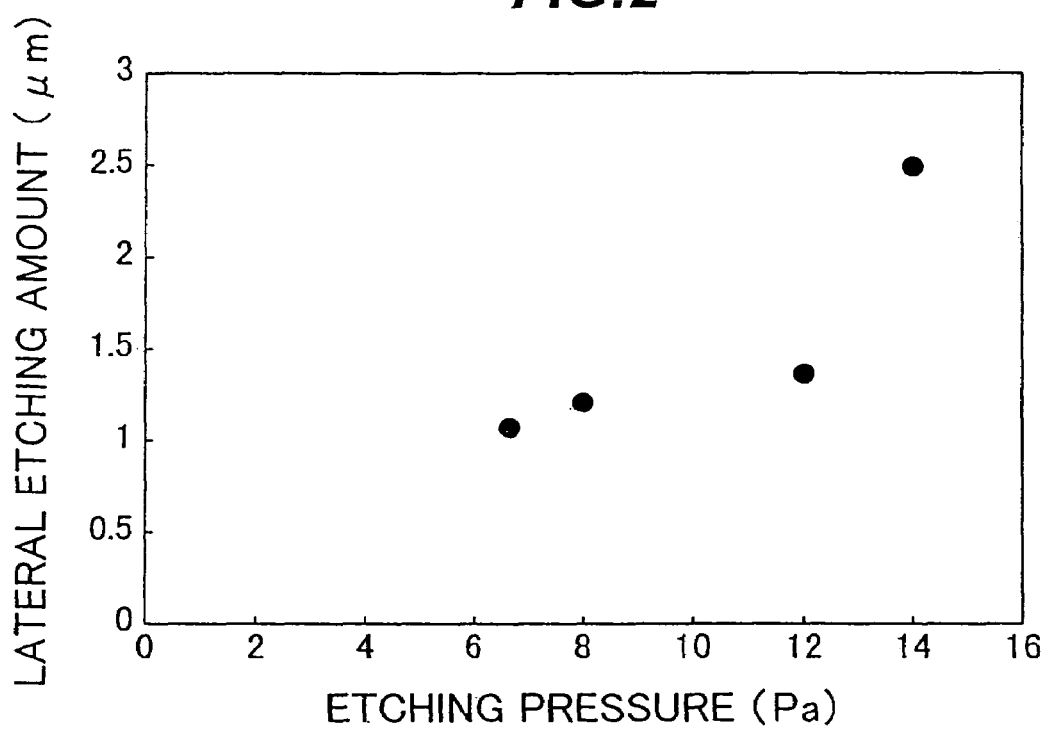
FIG. 2 is a graph showing a relation between an etching pressure and a lateral etching amount of a silicon nitride (SiN) film.

FIG. 2 is a graph showing a relation between an etching pressure and a lateral etching amount of a SiN film. The abscissa represents an etching pressure in the unit of Pa and the ordinate represents a lateral etching amount in the unit of µm. The etching was performed through RIE using a mixture gas of $SF_6$ at a flow rate of 200 sccm and $O_2$ at a flow rate of 200 sccm. The SiN film etched were formed under the same conditions as those used for the second insulating film 30 shown in FIG. 1, and the first insulating film 4 is disposed under the SiN film etched. The second insulating film 30 is side-etched while the whole thickness of the first insulating film 4 under the second insulating 30 is etched.

As shown in FIG. 2, as the etching pressure rises, the lateral etching amount increases. As the lateral etching amount increases, a contact area between the ITO film 35 and upper Ti film 17 shown in FIG. 1 becomes large and the contact resistance can be lowered. In order to establish good electrical contact between the ITO film 35 and source electrode 13S, it is preferable to set a retract amount of the inner wall of the opening 31b from the circumferential edge of the opening 31a to 1 µm or larger. However, it is necessary for the outermost circumferential edge of the opening 31a not to position outside of the outer edge of the source electrode 13S.

In this embodiment, although the intermediate layer (Al film 16) of the source and drain electrodes 13S and 13D is made of Al, it may be made of Al alloy. Although the uppermost layers of the source and drain electrodes 13S and 13D are made of Ti, they may be made of a different material which can provide a contact resistance with ITO lower than that between Al and ITO. Such materials may be Mo, Ta, W, oxide of these metals, nitride of these metals, and the like.

Figure 3:
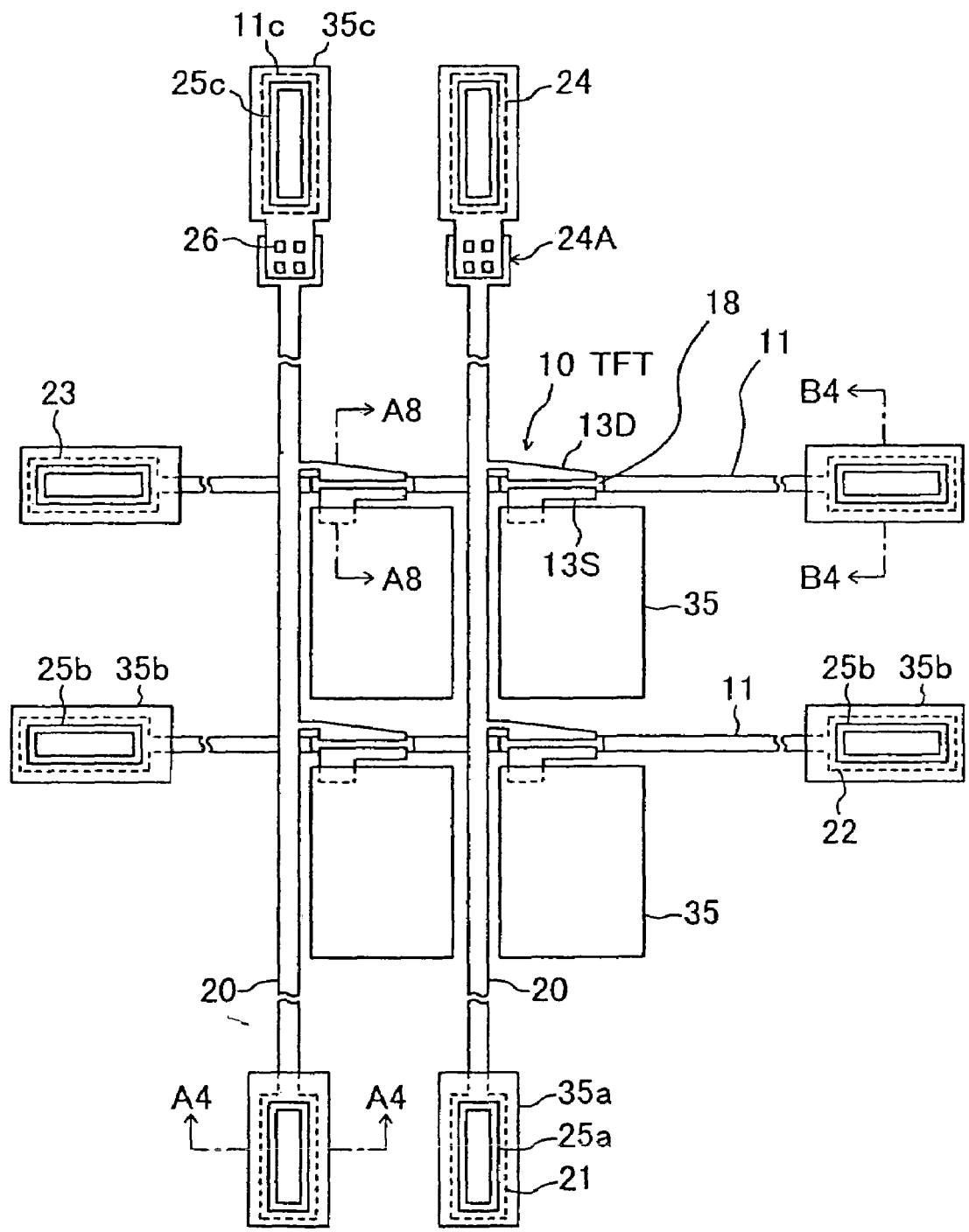
FIG. 3 is a plan view of a TFT substrate according to an embodiment of the invention.

FIG. 3 is a partial plan view of a TFT according to the second embodiment of the invention. On the surface of a glass substrate, a plurality of gate bus lines 11 are disposed extending in the row direction. For example, the gate bus line 11 is made of Cr. At one end (right end in FIG. 1) of each gate bus line 11, an inspection gate terminal 22 is disposed, and at the other end, a TAB gate terminal 23 is disposed. The gate bus line 11 is covered with a gate insulating film made of SiN.

On this gate insulating film, a plurality of drain bus lines 20 are disposed extending in the column direction. The drain bus line 20 has a three-layer structure of a Ti film/an Al film/a Ti film. At one end (lower end in FIG. 1) of each drain bus line 20, an inspection drain terminal 21 is disposed, and at the other end, a TAB drain terminal 24 is disposed.

At each of cross points between the gate bus lines 11 and drain bus lines 20, a TFT is disposed. A pixel electrode 35 is disposed in an area surrounded by adjacent two gate bus lines 11 and adjacent two drain bush lines 20. A drain 13D of a TFT 10 is connected to a corresponding drain bus line 20. A source electrode 13S of TFT 10 is connected to a corresponding electrode 35.

The gate bus line 11 corresponding to TFT 10 serves also as the gate electrode of TFT 10. A channel protective film 18 disposed for each TFT covers the channel layer of TFT 10.

The inspection drain terminal 21 is formed in the same layer by the same process as the drain bus line 20, and connected to a corresponding drain bus line 20. A terminal protective conductive film 35a is formed over the inspection drain terminal 21, both being electrically connected via a contact hole 25a.

The inspection gate terminal 22 is formed in the same layer by the same process as the gate bus line 11, and connected to a corresponding gate bus line 11. A terminal protective conductive film 35b is formed over the inspection gate terminal 22, both being electrically connected via a contact hole 25b. Similar to the inspection gate terminal 22, the terminal protective conductive film 35b is formed over the TAB gate terminal 23.

The TAB drain terminal 24 is formed in the same layer by the same process as the gate bus line 11. A terminal protective conductive film 35c is also formed over the TAB drain terminal 24, both being connected via a contact hole 25c. The terminal protective conductive film 35c is connected to a corresponding drain bus line 20 via a contact hole 26 at a connection part 24A.

By applying a voltage between one TAB gate terminal 23 and a corresponding inspection gate terminal 22, a conduction failure of the gate bus line 11 can be found. Similarly, a conduction failure of the drain bus line can be found. By applying a voltage between an inspection gate 22 and an inspection drain terminal 21, an insulation failure therebetween can be found.

The reason why the TAB drain terminal 24 is disposed in the same layer as the gate bus line 11 is to make the TAB drain terminal 24 and TAB gate terminal 23 have the same lamination structure.

Figure 4A:
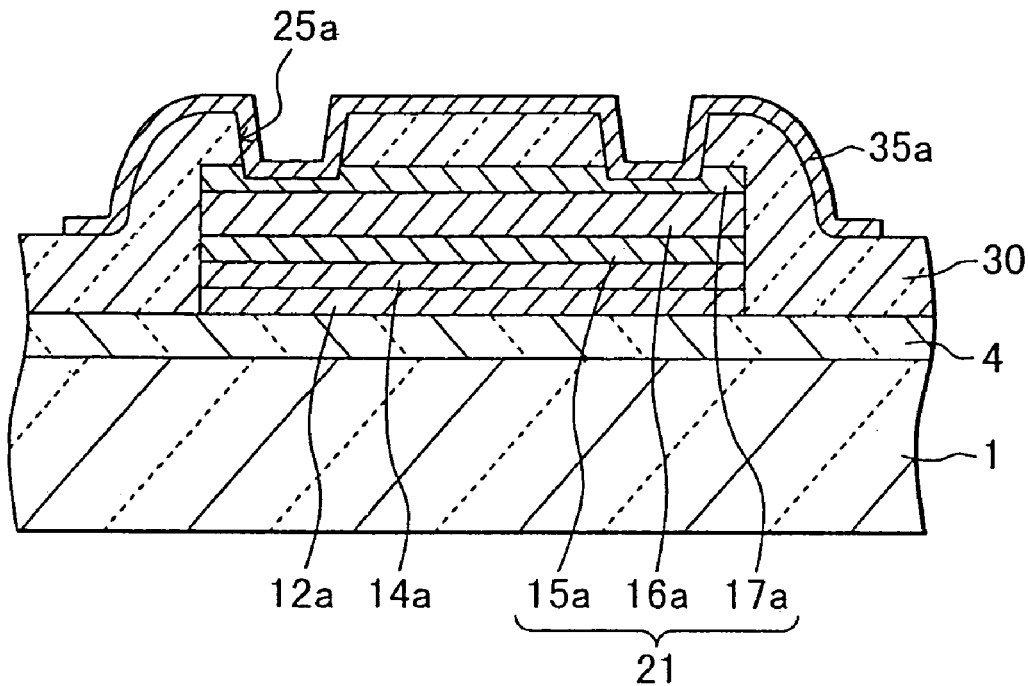
FIGS. 4A and 4B are cross sectional views of inspection terminals formed on TFT substrates according to a second embodiment of the invention.
Figure 8:
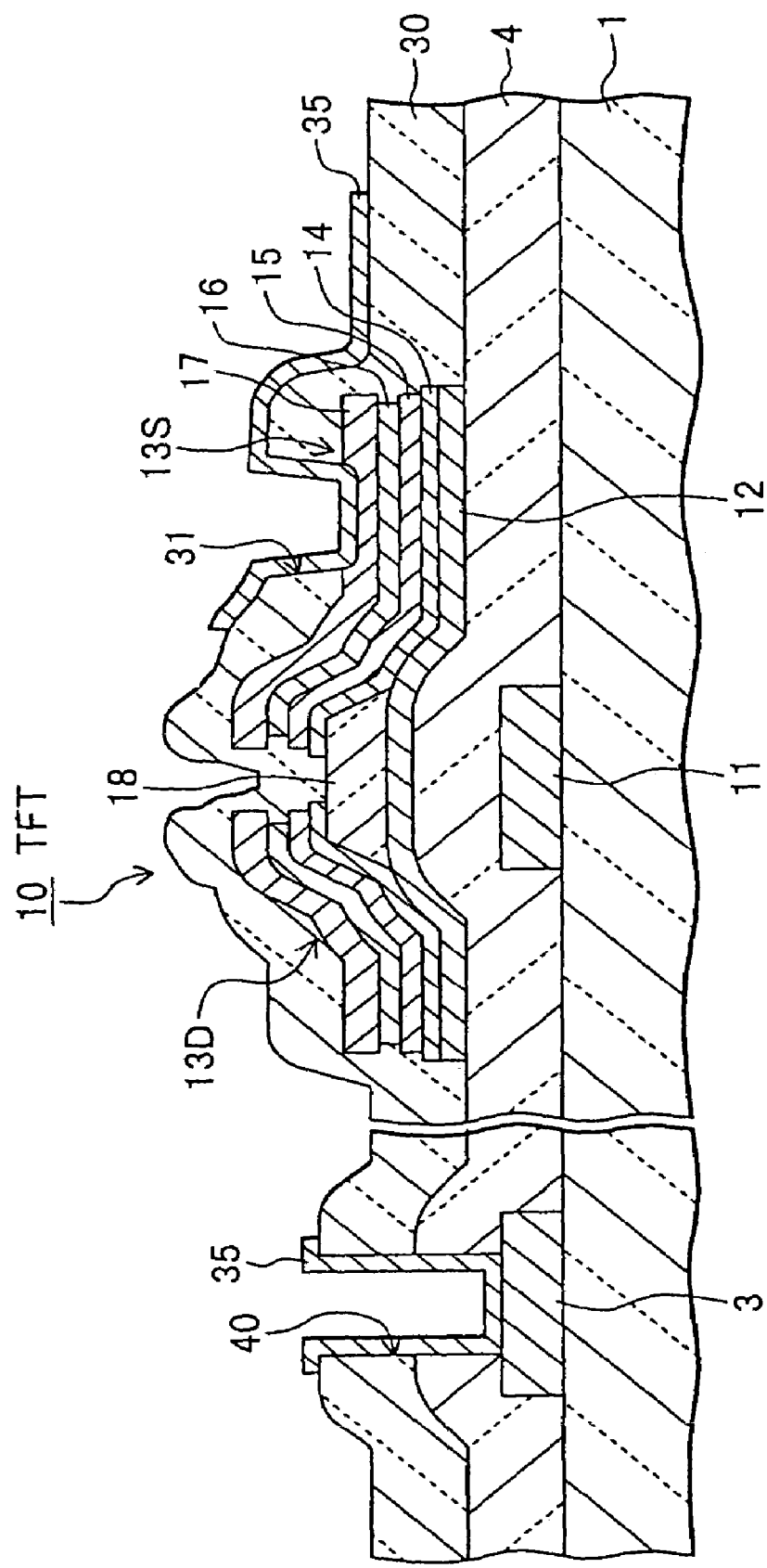
FIG. 8 is a cross sectional view of a conventional TFT substrate.
Figure 9:
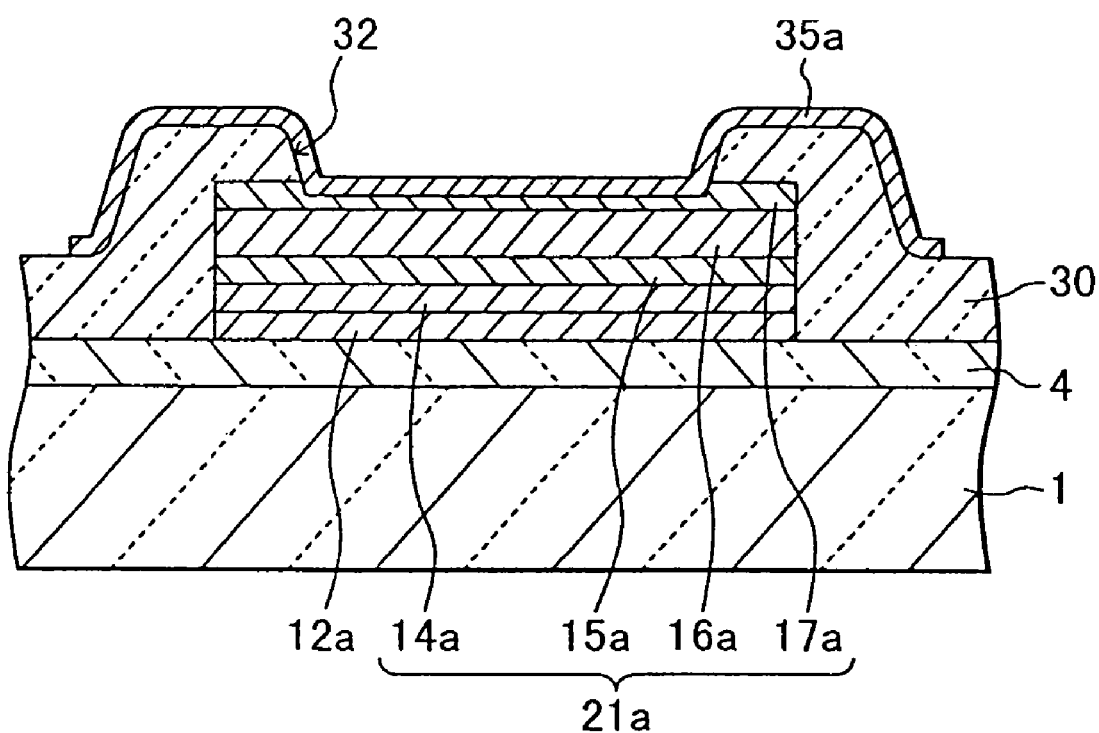
FIG. 9 is a cross sectional view of a conventional inspection terminal.

A cross sectional view taken along one-dot chain line A8—A8 corresponds to a TFT shown in FIG. 8. FIG. 4A is a cross sectional view taken along one-dot chain line A4—A4 of FIG. 3. A gate insulating film 4 covers the surface of a glass substrate 1. On a partial surface area of the gate insulating film 4, an amorphous silicon film 12a is formed. On the amorphous silicon film 12a, the inspection drain terminal 21 is formed. The inspection drain terminal 21 has a lamination structure of an amorphous silicon film 14a, a lower Ti film 15a, an Al film 16a, and an upper Ti film 17a, respectively stacked in this order.

On the gate insulating film 4, a protective insulating film 30 is formed covering the inspection drain terminal 21. The contact hole 25a is formed through the protective insulating film. As shown in FIG. 3, this contact hole 25a is disposed slightly inside the outer periphery of the inspection drain terminal 21, and has a ring shape extending along the outer periphery. Therefore, the protective insulating film 30 is left in the inner area of the contact hole when the inspection drain terminal 21 is viewed along a direction normal to the substrate surface.

The terminal protective conductive film 35a is formed on the protective insulating film 30, covering the inspection drain terminal 21. The terminal protective conductive film 35a is made in contact with the inspection drain terminal 21 via the contact hole 25a.

When the TFT substrate is inspected, a probe is made in contact with the terminal protective conductive film 35a on the protective insulating film 30 left in the inner area of the inspection drain terminal 21. Since the protective insulating film 30 is left under the contact point of the probe, it is possible to prevent the underlying inspection drain terminal 21 from being damaged by the probe.

Figure 4B:
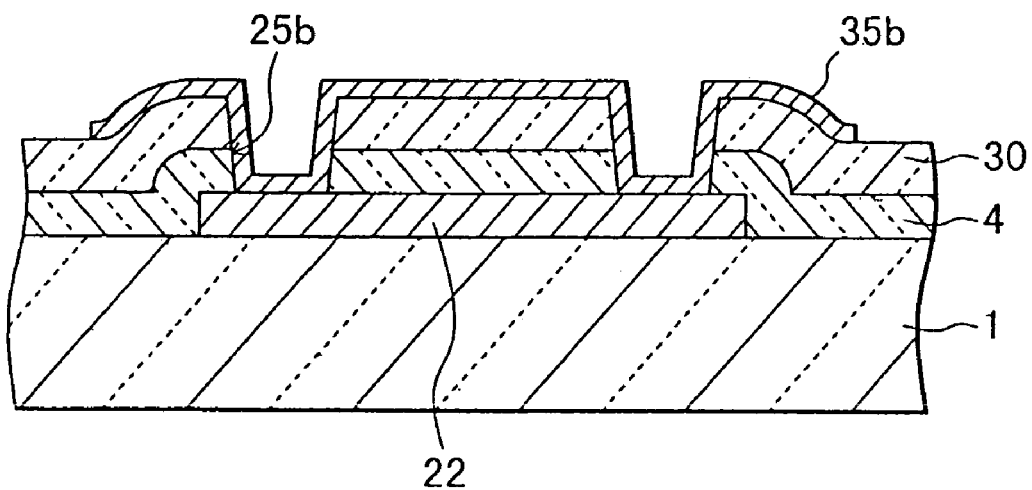

FIG. 4B is a cross sectional view taken along one-dot chain line B4—B4 shown in FIG. 3. The inspection gate terminal 22 made of Cr is formed on the surface of the glass substrate 1. The gate insulating film 4 and protective insulating film 30 are laminated covering the inspection gate terminal 22. The contact hole 25b is formed through the two layers, gate insulating film 4 and protective insulating film 30. As shown in FIG. 3, the contact hole 25b is disposed slightly inside the outer periphery of the inspection gate terminal 22, and has a ring shape extending along the outer periphery.

The terminal protective conductive film 35b is formed on the protective insulating film 30, covering the inspection gate terminal 22. The terminal protective conductive film 35b is connected via the contact hole 25b to the inspection gate terminal 22. Similar to the inspection drain terminal 21 shown in FIG. 4A, the gate insulating film 4 and protective insulating film 30 are left in the inner area of the contact hole when the inspection gate terminal 22 is viewed along a direction normal to the substrate surface. It is therefore possible to prevent the underlying inspection gate terminal 22 from being damaged by the probe.

Next, a manufacture method of a TFT substrate of the second embodiment will be described with reference to FIGS. 3 and 8. A Cr film is formed on the glass substrate 1 and patterned to leave the gate bus lines, 11, inspection gate terminals 22, TAB gate terminals 23, and TAB drain terminals 24. A gate insulating film 4 of SiN is deposited to a thickness of 400 nm over the surface of the glass substrate 1, covering the gate bus lines, 11, inspection gate terminals 22, TAB gate terminals 23, and TAB drain terminals 24.

On the surface of the gate insulating film 4, an amorphous silicon film is deposited to a thickness of 30 nm. In this film deposition, the substrate temperature is set to 310° C. This amorphous silicon film is patterned by a later process to form the channel layer 12. An SiN film is deposited to a thickness of 120 nm on the surface of the amorphous silicon film. This SiN film is patterned to leave the channel protective film 18.

A method of forming a resist pattern to be used for patterning the channel protective film 18 will be described. The glass substrate 1 is exposed from the bottom (back of the sheet of FIG. 3) by using the gate bus lines 11 as a mask to define the border along the periphery of each gate bus line 11. Next, by using an ordinary photomask, the glass substrate 1 is exposed from the bottom to define a border perpendicular to each gate bus line 11. After the exposure is performed twice, the resist mask is developed to form a resist pattern corresponding to the channel protective film 18. By using this resist pattern as a mask, the SiN film is etched to leave the channel protective film 18. Thereafter, the resist pattern is removed.

Next, an n$^+$-type amorphous silicon film of 30 nm thickness, a Ti film of 20 nm thickness, an Al film of 100 nm thickness, and a Ti film of 100 nm thickness are sequentially deposited over the whole substrate.

On the surface of the highest Ti film, a resist pattern corresponding to the source electrode 13S and drain electrode 13D is formed. By using this resist pattern as a mask, the layers down to the amorphous silicon film formed on the gate insulating film 4 are etched.

In the area above the gate bus line 11, the channel protective film 18 functions as an etching stopper so that the etching generally stops at the upper surface of the channel protective film 18. With this etching process, the channel layer 12, source electrode 13S, and drain electrode 13D are formed. At the same time, the drain bus lines 20 and inspection drain terminals 21 shown in FIG. 3 are formed.

The protective insulating film 30 of SiN is deposited to a thickness of 300 nm over the whole substrate surface. This deposition of the protective insulating film 30 is performed by the same method as the deposition of the gate insulating film 4.

A contact hole 31 is formed through the protective insulating film 30, and at the same time the contact hole 25a shown in FIG. 4A and the contact hole 26 shown in FIG. 3 are formed. At the same time when these contact holes are formed, the contact hole 25b shown in FIG. 4B is also formed through the first and second insulating films 4 and 30. These contact holes are formed by RIE using a mixture gas of $SF_6$ and $O_2$. The etching conditions are an $SF_6$ flow rate of 200 sccm, an $O_2$ flow rate of 200 sccm, and a pressure of 10 Pa.

In the second embodiment, although the contact structure shown in FIG. 8 is used for the connection between the source region of TFT 10 and the pixel electrode 35, the structure of the first embodiment shown in FIG. 1 may be used.

Figure 5:
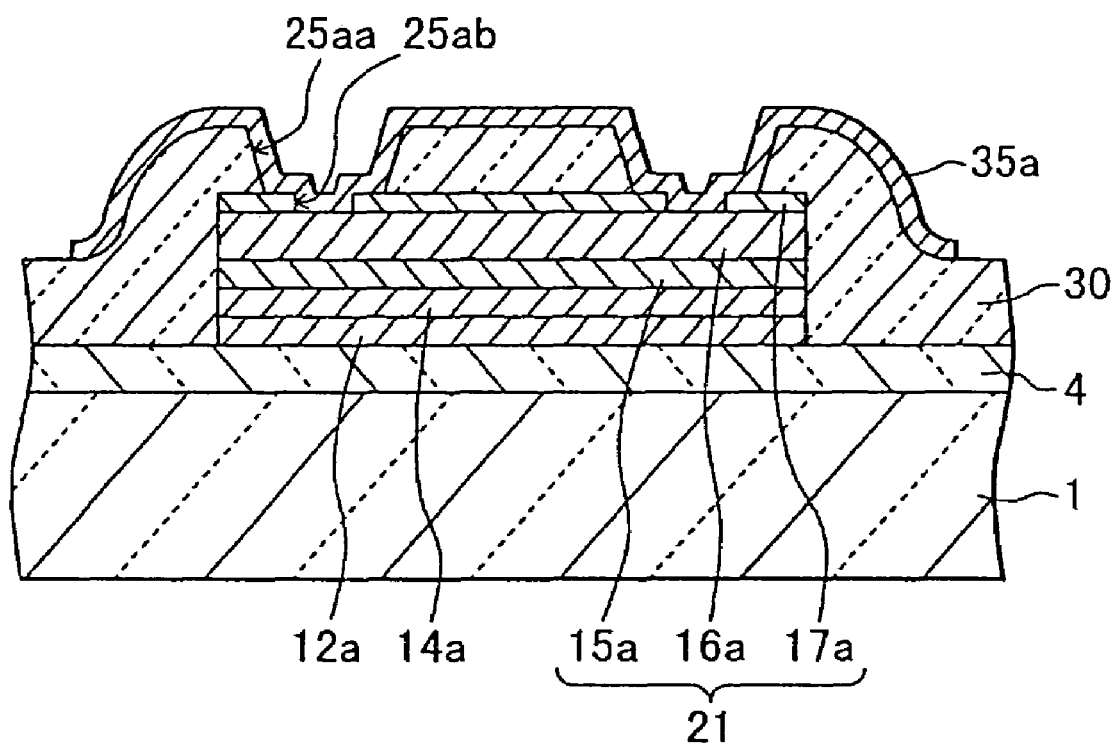
FIG. 5 is a cross sectional view of an inspection drain terminal according to the second embodiment of the invention.

FIG. 5 is a cross sectional view of an inspection drain terminal wherein the contact structure of the first embodiment is used for the connection between the source region of TFT and the pixel electrode 35. The plan view of a TFT substrate is similar to the plan view of the TFT substrate of the second embodiment shown in FIG. 3. In the second embodiment shown in FIG. 4A, the upper Ti film 17a is left on the bottom of the contact hole 25a. In contrast, in the structure shown in FIG. 5, a contact hole 25aa is formed through the protective insulating film 30 and a contact hole 25ab is formed through the upper Ti film 17a, similar to the contact holes 31a and 31b shown in FIG. 1.

The side wall of the contact holes 25aa and 25ab are formed with steps similar to the steps on the side wall of the contact holes 31a and 31b shown in FIG. 1. Therefore, good electrical contact between the terminal protective conductive film 35a and inspection drain terminal 21 can be realized.

Figure 6A:
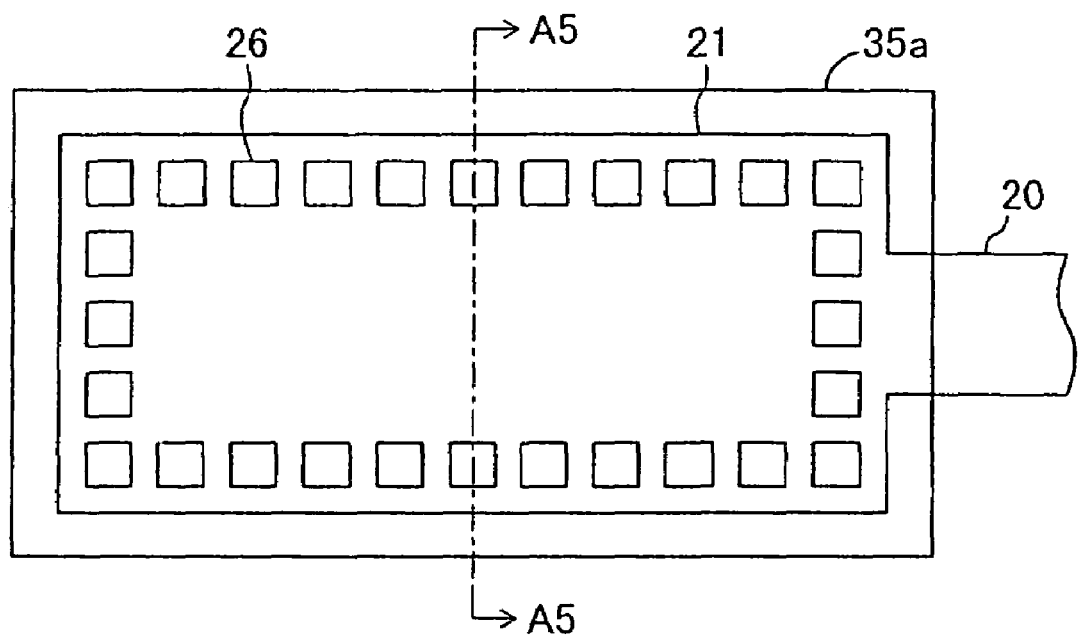
FIGS. 6A and 6B are plan views of inspection drain terminals according to modifications of the second embodiment of the invention.
Figure 6B:
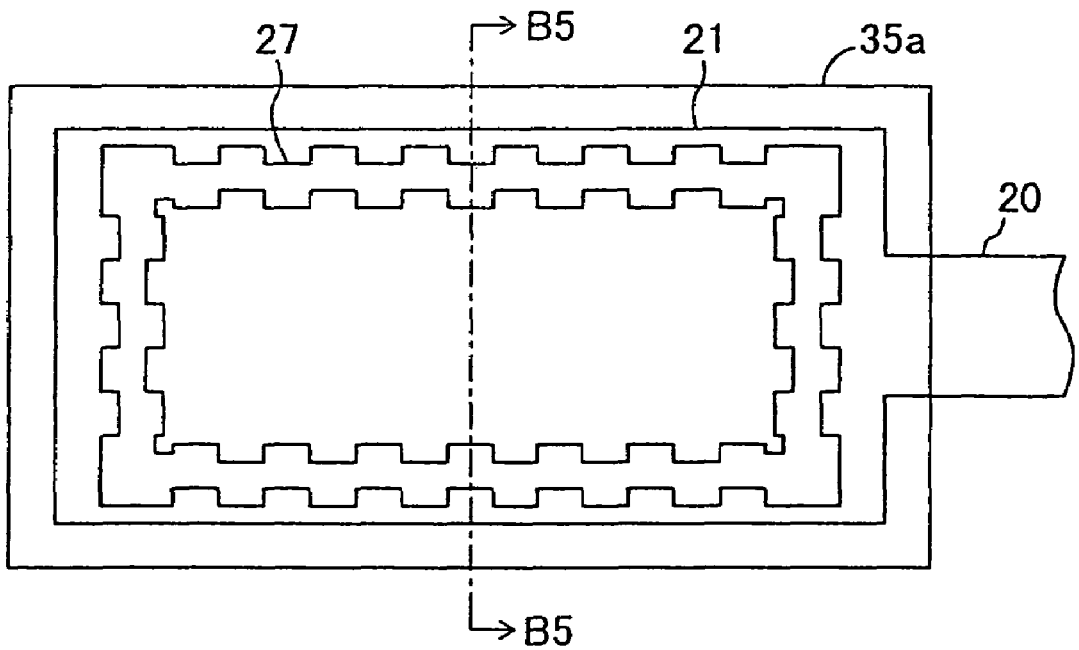

FIGS. 6A and 6B are plan views of TFT substrates according to first and second modifications of the second embodiment. In the second embodiment, as shown in FIG. 3, the contact hole 25a has a ring shape extending along the outer periphery of the inspection drain terminal 21, and the outer and inner peripheries of the contact hole 25a are generally straight lines.

In the first modification shown in FIG. 6A, in place of the contact hole 25a of the second embodiment, a plurality of contact holes 26 are disposed. The contact holes 26 are discretely disposed slightly inner than the outer periphery of the inspection drain terminal 21, and extend along the outer periphery. A cross sectional view taken along one-dot chain line A5—A5 shown in FIG. 6A is the same as that shown in FIG. 5. A total sum of lengths of the outer peripheries of the contact holes 26 is longer than the length of the outer periphery of the contact hole 25a shown in FIG. 3. Therefore, the area of the terrace at the step on the side wall of the contact holes 25aa and 25ab shown in FIG. 5 is large. A contact resistance between the terminal protective conductive film 35a and inspection drain terminal 21 can be made lower. Similarly, the contact resistance in the contact area shown in FIG. 3 can be made small by forming a plurality of contact holes 26.

In the second modification shown in FIG. 6B, in place of the contact hole 25a shown in FIG. 3, a contact hole 27 is used. The outer and inner peripheries of the contact hole 27 have zigzag patterns. Therefore, similar to the first modification, the area of the terrace at the step on the side wall of the contact hole can be made large and a contact resistance between the terminal protective conductive film 35a and inspection drain terminal 21 can be made lower. Similarly, the contact resistance in the contact area shown in FIG. 3 can be made small by forming the peripheries of the contact hole 26 in zigzag patterns.

In the above embodiment, the inspection drain terminal 21 and source electrode 13S use the Al film and upper Ti film. In place of the Al film, a film made of Cu, Al alloy, or Cu alloy may be used, and in place of the Ti film, a film made of Ti, Mo, W, Ta, alloy thereof, nitride thereof, or oxide thereof may also be used, with similar expected advantages of the embodiment.

Figure 7:
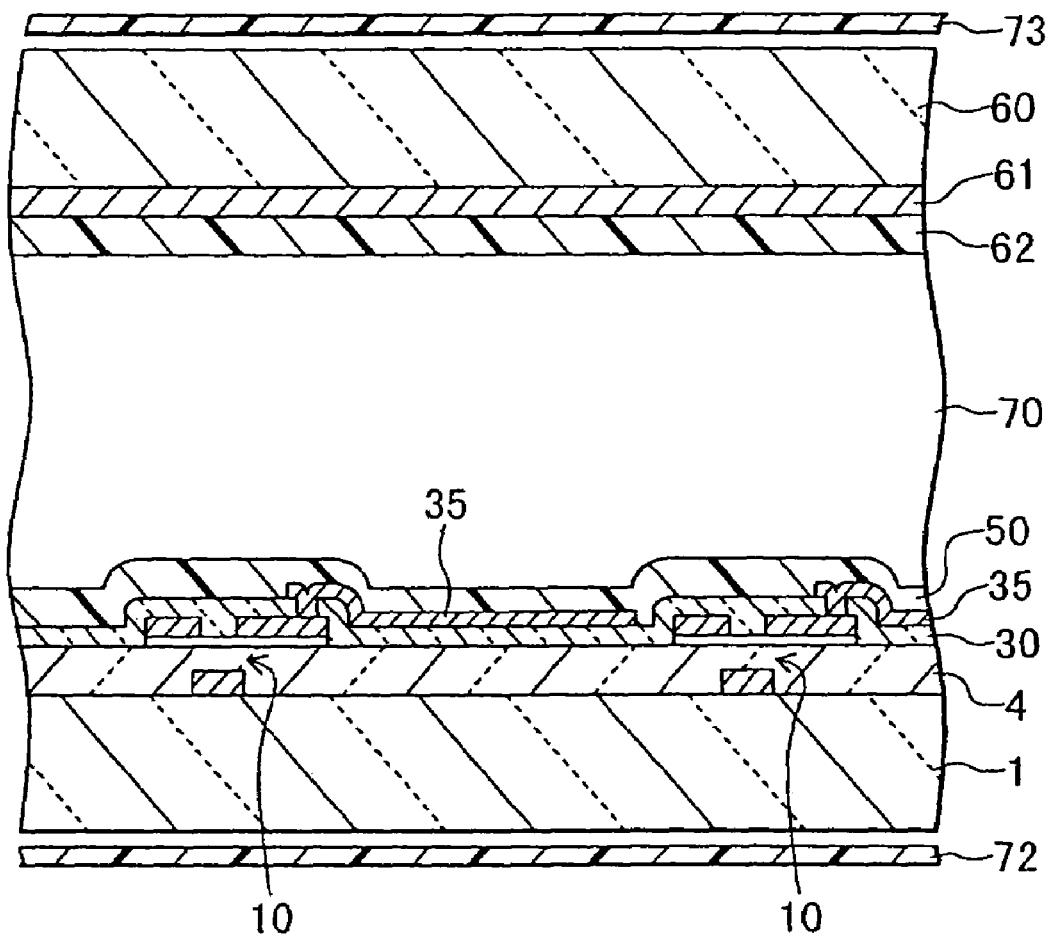
FIG. 7 is a cross sectional view of a LCD panel with a TFT substrate.

FIG. 7 shows an example of a liquid crystal display panel using the TFT substrate according to the embodiment of the invention. A plurality of TFT's 10 are formed on the surface of a glass substrate 1. TFT 10 is covered with a second insulating film 30. An ITO film 35 is formed on the surface of the second insulating film 30 in correspondence with each TFT 10. An alignment film 50 is formed on the second insulating film 30, covering the ITO film 35. A common electrode 61 is formed on the surface of a glass substrate 60, and another alignment film 62 is formed on the surface of the common electrode 61.

The glass substrates 1 and 60 are disposed with the alignment films 50 and 62 facing each other. Liquid material 70 is filled in a gap between the glass substrates 1 and 60. Polarizing films 72 and 73 are placed on the outer surfaces of the glass substrates 1 and 60. Color filters, light shielding films and the like may be disposed, if necessary, on the surface of the glass substrate 60.

The present invention has been described in connection with the preferred embodiments. The invention is not limited only to the above embodiments. It is apparent that various modifications, improvements, combinations, and the like can be made by those skilled in the art.

What is claimed is:

1. A TFT substrate comprising:
   an underlying substrate having an insulating surface;
   a gate electrode disposed on the insulating surface of said underlying substrate;
   a first insulating film covering the insulating surface of said underlying substrate and said gate electrode;
   a channel layer made of semiconductor and disposed on said first insulating film, the channel layer overriding said gate electrode;
   first and second conductive films made of Al or Al alloy and disposed on an upper surface of said channel layer on both sides of said gate electrode;
   a first upper conductive film disposed on said first conductive film and formed with a first opening;
   a second upper conductive film disposed on said second conductive film; and
   a second insulating film covering said first and second upper conductive films and said channel layer and formed with a second opening, an inner wall of the second opening being retreated from an inner wall of the first opening.

2. A TFT substrate comprising:
   an underlying substrate having an insulating surface;
   a first conductive film made of Al or Al alloy disposed over the underlying substrate;
   an upper conductive film made of a material different than Al disposed on said first conductive film and formed with a first opening; and
   an insulating film covering said upper conductive film and formed with a second opening, an inner wall of the second opening being retreated from an inner wall of the first opening.

3. A method of manufacturing a TFT substrate comprising the steps of:
   forming a gate electrode on a surface of an underlying substrate;
   forming a first insulating film on the underlying substrate, the first insulating film covering the gate electrode;
   forming a channel layer on the first insulating film, the channel layer overriding on the gate electrode, and forming a source electrode and a drain electrode on an upper surface of the channel layer, the source and drain electrodes covering areas on both sides of the gate electrode and including a conductive film made of Al or Al alloy and an upper conductive film disposed on the Al or Al alloy conductive film and made of a material different from Al;

forming a second insulating film on the first insulating film, the second insulating film covering the source electrode and the drain electrode; and forming a first opening through the second insulating film in an area corresponding to the source electrode and through the upper conductive film of the source electrode, an inner wall of the first opening in the second insulating film being retreated from an inner wall of the first opening in the upper conductive film.

4. A method of manufacturing a TFT substrate according to claim 3, wherein the first opening is formed through RIE.

5. A TFT substrate comprising:

an underlying substrate having an insulating surface;

a first conductive film disposed over the underlying substrate;

an upper conductive film disposed in direct contact with said first conductive film and formed with a first opening; and an insulating film covering said upper conductive film and formed with a second opening, an inner wall of the second opening being retreated from an inner wall of the first opening.

* * * * *